(12) United States Patent
Dean et al.

(10) Patent No.: US 6,953,619 B2
(45) Date of Patent: Oct. 11, 2005

(54) CONDUCTIVE THERMOPLASTIC COMPOSITIONS AND ANTENNAS THEREOF

(75) Inventors: David M. Dean, West Chester, PA (US); Mehrdad Mehdizadeh, Avondale, PA (US); Steven F. Fecanin, Carmel, IN (US); Stewart Carl Feinberg, Exton, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 71 days.

(21) Appl. No.: 10/767,919

(22) Filed: Jan. 29, 2004

(65) Prior Publication Data

US 2004/0222924 A1 Nov. 11, 2004

Related U.S. Application Data

(60) Provisional application No. 60/446,832, filed on Feb. 12, 2003.

(51) Int. Cl.[7] .................. B32B 27/04; B32B 15/08; H01Q 1/00; H01Q 1/36
(52) U.S. Cl. .................. 428/297.4; 428/298.7; 428/301.4; 29/600; 343/911.12; 343/907; 343/897; 343/896
(58) Field of Search .................. 428/297.4, 298.7, 428/301.4, 304.4; 29/600; 343/897, 896, 907, 911 R; 525/195, 191, 66

(56) References Cited

U.S. PATENT DOCUMENTS

| | | | |
|---|---|---|---|
| 3,331,073 A | 7/1967 | Horst | |
| 3,645,992 A | 2/1972 | Elston | |
| 4,076,698 A | 2/1978 | Anderson et al. | |
| 4,169,816 A | 10/1979 | Tsien | |
| 4,286,023 A | 8/1981 | Ongchin | |
| 4,651,152 A | 3/1987 | Harmuth | |
| 4,880,679 A | 11/1989 | Bonazza | |
| 5,004,561 A | 4/1991 | Nomura et al. | |
| 5,036,323 A | 7/1991 | Cain et al. | |
| 5,099,242 A | 3/1992 | Jaggard et al. | |
| 5,198,401 A | 3/1993 | Turner et al. | |
| 5,294,694 A | 3/1994 | Epstein et al. | |
| 5,405,922 A | 4/1995 | DeChellis et al. | |
| 5,661,484 A | 8/1997 | Shumaker et al. | |
| 6,249,261 B1 | 6/2001 | Solberg, Jr. et al. | |
| 6,320,548 B1 | 11/2001 | Harrell et al. | |
| 6,329,950 B1 | 12/2001 | Harrell et al. | |
| 6,409,942 B1 | 6/2002 | Narkis et al. | |
| 6,569,947 B1 * | 5/2003 | Feinberg | 525/195 |
| 6,596,815 B1 * | 7/2003 | Feinberg | 525/191 |
| 6,741,221 B2 | 5/2004 | Aisenbrey | |
| 6,756,443 B2 * | 6/2004 | Feinberg | 525/66 |
| 2002/0109634 A1 | 8/2002 | Aisenbrey | |

FOREIGN PATENT DOCUMENTS

| | | |
|---|---|---|
| FR | 2 660 116 | 9/1991 |
| WO | WO 93/26013 | 12/1993 |
| WO | WO 00/33418 | 6/2000 |

OTHER PUBLICATIONS

Edited by D. C. Allport and W. H. Janes, Block Copolymers, 1973, Chapters 4.4 and 4.7, Applied Science Publishers Ltd.

* cited by examiner

*Primary Examiner*—N. Edwards

(57) ABSTRACT

Disclosed are conductive polymeric materials comprising a resin-based structural material loaded with micron conductive fibers and/or micron conductive powders or to provide a conductive thermoplastic composition rather than an insulator. Also disclosed are antennas comprising the conductive thermoplastic compositions and methods for their fabrication.

37 Claims, 2 Drawing Sheets

CONDUCTIVE THERMOPLASTIC COMPOSITIONS AND ANTENNAS THEREOF

CROSS-REFERENCE TO RELATED APPLICATIONS

Applicant claims the benefit of priority to provisional application 60/446,832 filed Feb. 12, 2003; herein incorporated by reference in its entirety.

BACKGROUND OF THE INVENTION

1. Field of the Invention

This invention relates to conductive polymeric materials comprising a resin-based structural material loaded with micron-sized conductive fibers providing conductive thermoplastic compositions. This invention also relates to antennas comprising this material.

2. Description of the Related Art

Antennas are essential parts of electronic communication systems that contain wireless links. Such applications as communications and navigation require reliable and sensitive antennas. Antennas conduct electrical signals and currents so that electromagnetic energy is transmitted and/or received. This requires that the materials of the antennas, especially the antenna elements, be electrically conductive, which in the past required that they be made from metals. Antennas have been typically fabricated from conductive metal antenna elements in a wide variety of configurations. Lowering the cost of antenna materials or production costs in fabrication of antennas offers significant advantages for any applications utilizing antennas.

Metals typically require high temperatures for fabrication into articles by molding techniques and/or their hardness makes machining articles more difficult, resulting in high fabrication costs. Metals may also be subject to corrosion or other environmental damage, particularly when placed in marine environments such as on boats or ships. Therefore, it is desirable to develop conductive materials other than metals from which to fabricate antennas. It is also desirable to reduce the weight of a wide variety of devices by the replacement of metal parts with lighter-weight components. Thermoplastic polymeric materials have often been used to replace metal parts because of their ease in fabrication and lower weight. However, typical thermoplastic polymers have been found to be nonconductive and therefore unsuitable for antenna applications. Thermoplastic polymers have been filled with conductive materials such as carbon black, conductive glass fibers, or metal powders or fibers to provide semiconductive compositions for use in applications such as electrostatic discharge and shielding wire, cable and electronic devices from electromagnetic interference (see for example, U.S. Pat. Nos. 4,169,816; 4,286,023; 5,004,561 and 6,409,942).

PCT Patent Application Publication WO 93/26013 describes a telescopic antenna comprising a principal structural component based on a polymeric material associated with or impregnated with conductive material in the form of fibers or particles. PCT Patent Application Publication WO 00/33418 describes a bar antenna comprised of an electrically conductive plastic. French Patent Application FR2660116 describes antennas comprising thermoplastic material impregnated with conducting material. U.S. Patent Application 20020109634 discloses antennas formed of conductive loaded resin-based materials.

BRIEF SUMMARY OF THE INVENTION

It is a principle objective of this invention to provide antennas that are lightweight, easy to fabricate, low in cost and/or resistant to corrosion or other environmental damage. This objective is achieved by fabricating the antenna elements and ground planes from conductive thermoplastic compositions. These conductive thermoplastic compositions are thermoplastic resins loaded with conductive materials to provide a resin-based material that is a conductor rather than an insulator. The resins provide the structural matrices which, when loaded with micron-sized conductive fibers, become composites that are conductors rather than insulators.

Accordingly, this invention provides an antenna comprising a conductive thermoplastic composition comprising 15 to 70 weight percent conductive fibers dispersed in a structural matrix comprising at least one thermoplastic structural resin having a dielectric constant of less than about 5.0 at 1 kilohertz; provided (i) when said composition comprises a polyamide resin or an epoxide resin, an additional thermoplastic structural resin must also be present;

(ii) when said composition comprises a polyester resin, an additional thermoplastic structural resin other than an acrylonitrile/styrene/acrylate resin must also be present.

It is another principle objective of this invention to provide methods of forming antennas from the conductive thermoplastic compositions of this invention. This invention provides a method of fabricating an antenna comprising:

(a) dispersing from about 15 to about 70 weight percent conductive fibers in a structural matrix comprising at least one thermoplastic structural resin having a dielectric constant of less than about 5.0 at 1 kilohertz to form a conductive thermoplastic composition;

(b) forming said conductive thermoplastic composition into the desired shape for an antenna; provided (i) when said composition comprises a polyamide resin or an epoxide resin, an additional thermoplastic structural resin must also be present;

(ii) when said composition comprises a polyester resin, an additional thermoplastic structural resin other than an acrylonitrile/styrene/acrylate resin must also be present.

It is another principle objective of this invention to provide a conductive thermoplastic composition useful for preparing antennas.

Accordingly, this invention provides a conductive thermoplastic composition comprising 15 to 70 weight percent conductive fibers dispersed in a structural matrix comprising an ionomeric resin.

A preferred embodiment of the conductive thermoplastic composition, and antennas thereof, of this invention comprises an ionomeric resin comprising one or more E/X/Y copolymers where E is ethylene, X is derived from a $C_3$ to $C_8$ $\alpha,\beta$ ethylenically unsaturated carboxylic acid, and Y is derived from an alkyl acrylate or an alkyl methacrylate wherein the alkyl groups have from 1 to 8 carbon atoms, and wherein X is present in from about 2 to about 30 weight % of the E/X/Y copolymer, Y is present from 0 to about 40 weight % of the E/X/Y copolymer; and the E/X/Y copolymer has a weight average molecular weight of from 80,000 to 500,000 and is at least partially neutralized by one or more alkali metal, transition metal, or alkaline earth metal cations.

This invention also provides a conductive thermoplastic composition comprising 15 to 70 weight percent conductive fibers dispersed in a structural matrix comprising a polyolefin resin.

DETAILED DESCRIPTION OF THE INVENTION

Figure 1:
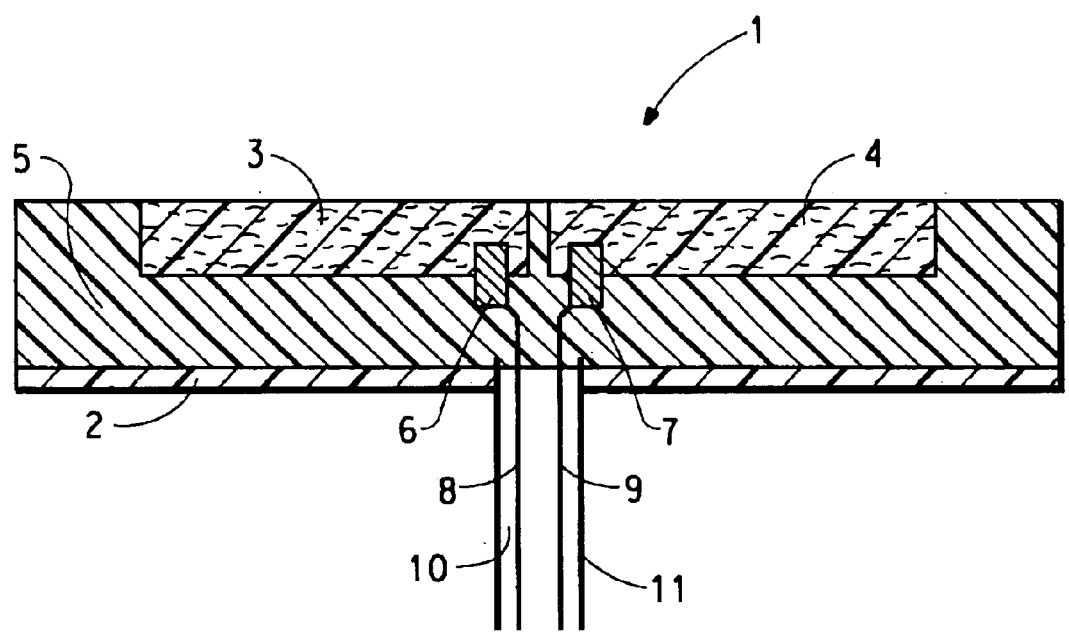
FIG. 1 is a cross-sectional view of a dipole antenna of this invention.

All references disclosed herein are incorporated by reference.

"Copolymer" means polymers containing two or more different monomers. The terms "dipolymer" and "terpolymer" mean polymers containing only two and three different monomers respectively. The phrase "copolymer of various monomers" means a copolymer whose units are derived from the various monomers.

Thermoplastic resins are polymeric materials that can flow when heated under pressure. Melt index (MI) is the mass rate of flow of a polymer through a specified capillary under controlled conditions of temperature and pressure. Melt indices reported herein are determined according to ASTM 1238 at 190° C. using a 2,160 g weight.

A dielectric is a material having a relatively low electrical conductivity, i.e. an insulator; or a substance that contains few or no free electrons and which can support electrostatic stresses. Two principal properties of a dielectric are its dielectric constant (the factor by which the electric field strength in a vacuum exceeds that in the dielectric for the same distribution of charge). Therefore, the dielectric constant is the ratio of the capacity of a condenser with a given substance as dielectric to the capacity of the same condenser with a vacuum for dielectric. It is a measure of the amount of electrical charge that a given substance can withstand at a given electric field strength. The dielectric constant ($\in$) for a material is a function of temperature and frequency and can be determined according to ASTM method D150. Dielectric strength is a measure of the resistance of a dielectric to electrical breakdown under the influence of strong electric fields. It is sometimes referred to as breakdown potential. It is usually expressed in volts per centimeter or volts per mil. It can be measured, for example, according to ASTM D149 at a thickness of 90 mils.

As indicated above, this invention provides an antenna comprising a conductive thermoplastic composition comprising 15 to 70 weight percent conductive fibers dispersed in a structural matrix comprising at least one thermoplastic structural resin having a dielectric constant of less than about 5.0 at 1 kilohertz; provided (i) when said composition comprises a polyamide resin or an epoxide resin, an additional thermoplastic structural resin must also be present;

(ii) when said composition comprises a polyester resin, an additional thermoplastic structural resin other than an acrylonitrile/styrene/acrylate resin must also be present.

Preferred are conductive thermoplastic compositions and antennas comprising thermoplastic structural resins having a dielectric constant of less than about 3.0 at 1 kilohertz. Such resins include polyolefins such as polyethylene, polypropylene, polybutylene and polymethylpentene; polyphenylene oxide; fluorinated polymers such as Teflon® and Tefzel®; and ionomeric resins. More preferred are thermoplastic resins having a dielectric constant of from about 2.0 to about 2.8 at 1 kilohertz. More preferred are polyethylene, polypropylene and ionomeric resins. Particularly preferred are ionomeric resins that are ethylene acid copolymers at least partially neutralized by one or more alkali metal, transition metal, or alkaline earth metal cations. Also particularly preferred is polyethylene and also particularly preferred is polypropylene.

Of note is an antenna comprising a conductive thermoplastic composition comprising 15 to 70 weight percent conductive fibers dispersed in a structural matrix comprising at least one thermoplastic structural resin having a dielectric strength greater than about 450 V/mil. Preferred thermoplastic resins having a dielectric strength greater than about 450 V/mil include polyolefins such as polyethylene, polypropylene, polybutylene and polymethylpentene; polyphenylene oxide; fluorinated polymers such as Teflon® and Tefzel®; and ionomeric resins. Also of note is an antenna comprising a conductive thermoplastic composition comprising 15 to 70 weight percent conductive fibers dispersed in a structural matrix comprising at least one thermoplastic structural resin having a dielectric strength greater than about 500 V/mil, particularly from about 600 to about 1,300 V/mil, and even more particularly from about 800 to about 1,200 V/mil, wherein the structural resin comprises an ionomeric resin comprising ethylene acid copolymers at least partially neutralized by one or more alkali metal, transition metal, or alkaline earth metal cations.

Ionomeric resins ("ionomers") are copolymers of an olefin such as ethylene with a metal salt of an unsaturated carboxylic acid, such as acrylic acid, methacrylic acid, or maleic acid, and optionally softening comonomers. At least one alkali metal, transition metal, or alkaline earth metal cation, such as lithium, sodium, potassium, magnesium, calcium, or zinc, or a combination of such cations, is used to neutralize some portion of the acidic groups in the copolymer resulting in a thermoplastic resin exhibiting enhanced properties. For example, "Ethylene/(meth)acrylic acid (abbreviated E/(M)AA)" means a copolymer of ethylene (abbreviated E)/acrylic acid (abbreviated AA) and/or ethylene/methacrylic acid (abbreviated MAA); which can then be at least partially neutralized by one or more alkali metal, transition metal, or alkaline earth metal cations to form an ionomer. Terpolymers can also be made from an olefin such as ethylene, an unsaturated carboxylic acid and other comonomers such as alkyl (meth)acrylates providing "softer" resins that can be neutralized to form softer ionomers. Ionomers can also be modified by incorporation of organic acids or salts thereof.

Ionomers useful in this invention include E/(M)AA dipolymers having from about 2 to about 30 weight % (M)AA with a weight average molecular weight of from about 80,000 to about 500,000, at least partially neutralized by one or more alkali metal, transition metal, or alkaline earth metal cations. Preferred for preparing conductive thermoplastic compositions, and antennas thereof, are ethylene copolymers having from about 7 to about 20 weight % (M)AA, (with methacrylic acid particularly preferred) at least partially neutralized by one or more alkali metal, transition metal, or alkaline earth metal cations.

Neutralization can be effected by first making the E/(M) AA copolymer and treating the copolymer with inorganic base(s) with alkali metal, alkaline earth metal or transition metal cation(s). A wide range of cations is known for neutralizing acid moieties in the acid copolymer. Typical cations include lithium, sodium, potassium, magnesium, calcium, barium, lead, tin, zinc, aluminum, and combinations of such cations. Of note are ionomers neutralized with transition metal cations. Of particular note are ionomers comprising zinc as a neutralizing cation. The degree of neutralization is known to vary over a wide range. Preferably the degree of neutralization is from about 10 to about 70%, and more preferably from about 15 to about 60%. Methods for preparing ionomers from copolymers are well known in the art.

As noted above, comonomers such as alkyl (meth) acrylates can be included in the E/(M)AA copolymer to form a terpolymer that can be neutralized with alkali metal, alkaline earth metal or transition metal cations. Preferred are comonomers selected from alkyl acrylate and alkyl methacrylate wherein the alkyl groups have from 1 to 8 carbon atoms, and more preferred are comonomers selected from methyl acrylate, ethyl acrylate and n-butyl acrylate. Preferably the alkyl (meth)acrylates are included in amounts from 0 to about 30 weight % alkyl (meth)acrylate and more preferably from 0 to 15 weight %.

As described above, the ethylene acid ionomers can be melt-blended with other ionomers or polymers and/or modified by incorporation of other components. For example, an ionomer composition can be blended with at least one additional nonionomeric thermoplastic resin selected from the group consisting of polyurethane; polyurea; polyamide; polyester; polycarbonate; polystyrene; acrylics; copoly-ether-ester; copoly-ether-amide; copoly-ether-urethane; copoly-ether-urea; polyolefins; elastomeric polyolefins; polyethylene; polypropylene; ethylene copolymers derived from copolymerization of ethylene and polar comonomers selected from the group consisting of vinyl acetate, alkyl (meth)acrylate, carbon monoxide, and epoxy containing comonomers; maleic anhydride modified polymers; and thermoplastic elastomers based on styrene-butadiene block copolymers. For a specific example, the E/X/Y copolymer is blended with polyethylene containing about 1 weight % maleic anhydride comonomer. In particular, the conductive thermoplastic composition of this invention therefore relates to the above copolymers and blends thereof that are loaded with micron conductive metal fibers.

Specifically preferred ionomers useful in this invention include E/X/Y copolymers selected from the group consisting of a copolymer of ethylene, 9 weight % methacrylic acid, and 24 weight % n-butyl acrylate with the acid 51% (on a molar basis) neutralized (i.e., the carboxylic acid groups being converted to salt) using Zinc(II) cations; a copolymer of ethylene and 15 weight % methacrylic acid with the acid 58% neutralized using Zinc(II) cations; and a copolymer of ethylene and 9 weight % methacrylic acid with the acid 18% neutralized using Zinc(II) cations.

Further, specifically preferred ionomers useful in this invention also include a copolymer of ethylene and 19 weight % methacrylic acid with 36% on a molar basis of the carboxylic acid groups neutralized using Zinc(II) cations.

Polyolefins suitable for use in the present invention are selected from polypropylenes, polyethylene polymers and copolymers. Polyethylenes useful for use herein can be prepared by a variety of methods, including well-known Ziegler-Natta catalyst polymerization (see U.S. Pat. No. 4,076,698 and U.S. Pat. No. 3,645,992 for examples), metallocene catalyst polymerization (see U.S. Pat. No. 5,198,401 and U.S. Pat. No. 5,405,922 for examples) and by free radical polymerization. Polyethylene polymers useful herein can include linear polyethylenes such as high density polyethylene (HDPE), linear low density polyethylene (LLDPE), very low or ultralow density polyethylenes (VLDPE or ULDPE) and branched polyethylenes such as low density polyethylene (LDPE). The densities of polyethylenes suitable for use in the present invention range from 0.865 g/cc to 0.970 g/cc. Linear polyethylenes for use herein can incorporate alpha-olefin comonomers such as butene, hexene or octene to decrease their density within the density range so described.

Polypropylene (abbreviated PP) polymers useful in the practice of the present invention include propylene homopolymers, random copolymers, block copolymers and terpolymers of propylene, impact modified polypropylene and copolymers of propylene and alpha-olefins. Copolymers of propylene include copolymers of propylene with other olefins such as ethylene, 1-butene, 2-butene and the various pentene isomers, etc. and preferably copolymers of propylene with ethylene. Terpolymers of propylene include copolymers of propylene with ethylene and one other olefin. Random copolymers, also known as statistical copolymers, are polymers in which the propylene and the comonomer(s) are randomly distributed throughout the polymeric chain in ratios corresponding to the feed ratio of the propylene to the comonomer(s). Block copolymers are made up of chain segments consisting of propylene homopolymer and of chain segments consisting of, for example, random copolymer of propylene and ethylene. The term "polypropylene" when used herein is used generically to refer to any or all of the polymers comprising propylene described above.

Polypropylene homopolymers or random copolymers can be manufactured by any known process. For example, polypropylene polymers can be prepared in the presence of catalyst systems of the type known as Ziegler-Natta, based on organometallic compounds and on solids containing titanium(+4) trichloride.

Block copolymers can be manufactured similarly, except that propylene is generally first polymerized by itself in a first stage and propylene and additional comonomers such as ethylene are then polymerized, in a second stage, in the presence of the polymer obtained during the first. Each of these stages can be carried out, for example, in suspension in a hydrocarbon diluent, in suspension in liquid propylene, or else in gaseous phase, continuously or noncontinuously, in the same reactor or in separate reactors.

Additional information relating to block copolymers and to their manufacture may be found particularly in chapters 4.4 and 4.7 of the work "Block Copolymers" edited by D. C. Allport and W. H. Janes, published by Applied Science Publishers Ltd in 1973, which are incorporated by reference in the present description.

As noted above, the conductive thermoplastic compositions of this invention comprise micron-sized conductive fibers loaded in a structural resin. The micron-sized conductive fibers can be formed of metals such as nickel, copper, silver, stainless steel or the like. The micron conductive fibers can be nickel-plated carbon (also known as nickel coated graphite) fibers, stainless steel fibers, copper fibers, silver fibers, carbon fibers, or the like. Of note are conductive fibers comprising stainless steel. Of particular note are stainless steel fibers of a special 304 alloy of stainless steel. Of note are stainless steel fibers with a diameter of from about 5 to about 25 microns, particularly of from about 8 to about 11 microns. Of note are such fibers with an initial pre-processing length of from about 2 to about 10 mm, particularly from about 4 to about 6 mm. Such fibers can be obtained from Bekaert Fibre Technologies under the trade name Beki-Shield®. Also of note are conductive carbon fibers.

Of note are mixtures of conductive fibers and conductive powders in a polymeric structural matrix. For example, a mixture of carbon conductive fibers and carbon conductive powders in a polymeric structural matrix provides a conductive composition suitable for use as an antenna. The polymeric structural matrix can comprise, for example, an ionomer or a polyolefin such as polyethylene.

Preferred conductive thermoplastic compositions suitable for preparing antennas of this invention are those wherein stainless steel fibers are present in amounts from about 18 weight % to about 60 weight %; more preferably from about 25 weight % to about 50 weight % and even more preferably from about 28 weight % to about 42 weight %.

The conductive thermoplastic compositions of this invention typically but not exclusively have a volume electrical resistance of less than 100 ohms when measured end to end over a roughly cylindrical volume having a diameter of about 0.15 inches to about 0.5 inches and a length of 5.5 inches. The conductive thermoplastic compositions of this invention preferably have a conductivity in Siemens/meter of between 100 S/m and 100,000 S/m (i.e., a resistivity of between 1 $\Omega$-cm and 0.001 $\Omega$-cm).

The conductive thermoplastic compositions of this invention may also be formed into shapes by, for example, injection molding (i.e. extrusion of the molten composition into molds in a configuration to produce an article comprising the conductive thermoplastic composition in desired shape followed by cooling). Sheets of the conductive thermoplastic composition may be produced by extrusion through a laminar die and processing the composition by, for example, cast sheet, extrusion coating or lamination techniques well know in the polymer processing art.

The conductive thermoplastic compositions of this invention may also be coextruded with other thermoplastic polymers to form multilayer materials. The conductive thermoplastic composition can also be formed into multilayer films or sheets by extrusion coating or lamination techniques.

The antenna elements used to form the antennas are formed of the conductive thermoplastic compositions of this invention and can be formed using methods such as injection molding, compression molding, overmolding, or extrusion. The antenna elements can also be stamped to produce the desired shape. The conductive thermoplastic composition antenna elements can also be cut or milled as desired. The composition of the composite materials can affect the antenna characteristics and must be properly controlled. The conductive thermoplastic composition can also be formed into thin films or sheets to provide a cloth-like material which, when properly designed in metal content and shape, can be used to realize a very high performance cloth antenna. Such a cloth antenna could be embedded in a person's clothing as well as in insulating materials such as rubber or plastic. The conductive cloths could also be laminated to materials such as Teflon® fluoropolymer (available from DuPont) or nonwoven fibrous material (such as Tyvek® spun bonded olefin from DuPont) to provide a multilayer cloth-like material. Although the conductive thermoplastic composition can be used to form rigid articles consisting essentially of the conductive thermoplastic composition, it can also be laminated, adhered or attached to other rigid materials such as FR-4 copper, or any resin-based hard material to form rigid articles.

Optionally, articles comprising the conductive thermoplastic composition of this invention may be further processed. For example, portions of the composition (such as, but not limited to, pellets, slugs, rods, ropes, sheets and molded articles) may be subjected to thermoforming operations in which the composition is subjected to heat, pressure and/or other mechanical forces to produce shaped articles. Compression molding is an example of further processing.

Antennas

This invention provides a method of fabricating an antenna comprising:

(a) dispersing from about 15 to about 70 weight percent conductive fibers in a structural matrix comprising at least one thermoplastic structural resin having a dielectric constant of less than about 5.0 at 1 kilohertz to form a conductive thermoplastic composition;

(b) forming said conductive thermoplastic composition into the desired shape for an antenna; provided (i) when said composition comprises a polyamide resin or an epoxide resin, an additional thermoplastic structural resin must also be present;

(ii) when said composition comprises a polyester resin, an additional thermoplastic structural resin other than an acrylonitrile/styrene/acrylate resin must also be present.

Preferred is the above method of fabricating an antenna wherein the structural matrix comprises at least one thermoplastic structural resin having a dielectric constant of less than about 3.0 at 1 kilohertz.

Almost any type of antenna can be fabricated from the conductive thermoplastic compositions, such as dipole antennas, monopole antennas, conformal antennas, planar antennas, array antennas, direction-finding antennas and the like. The conductive thermoplastic compositions of this invention can be molded or extruded to provide an article that is the desired shape for an antenna. The conductive thermoplastic compositions of this invention can be cut, injection molded, compression molded, overmolded, laminated, extruded, milled or the like to provide the desired antenna shape and size. The antenna characteristics depend on the composition of the conductive thermoplastic compositions, which can be adjusted to aid in achieving the desired antenna characteristics. These antennas can be tuned to a desired frequency range.

The following embodiments are examples of antennas fabricated using conductive thermoplastic compositions of this invention. Preferred antennas comprise the preferred conductive thermoplastic compositions of this invention. In some of the examples ground planes are also used and these ground planes can be formed of either conductive thermoplastic compositions or metals. The use of these conductive thermoplastic compositions in antenna fabrication significantly lowers the cost of materials and manufacturing processes used in the assembly of antennas and the ease of forming these materials into the desired shapes. These materials can be used to form either receiving or transmitting antennas. The antennas and/or ground planes can be formed using methods such as injection molding, compression molding, overmolding, or extrusion of the conductive thermoplastic compositions.

Examples of antennas that comprise the conductive thermoplastic compositions include dipole antennas, monopole antennas, conformal antennas, planar antennas, array antennas and direction-finding antennas. Depending on their intended function, the antennas of this invention may be fabricated with additional elements such as ground planes, insulating materials, amplifiers, global positioning system components, connectors and the like to prepare a functional antenna. The antennas of this invention can be incorporated with other components into devices that rely on the transmission and/or reception of radio frequency electromagnetic radiation for their function such as radios, wireless communication devices and the like.

Electrical connection to a thermoplastic antenna element, or a thermoplastic ground plane usually involves the transfer of electrical signals to or from a metal to the thermoplastic material. This connection preferably has a relatively large surface area, and preferably involves some pressure in order to obtain a good transfer of electrical signals. Insertion of a metal piece into the thermoplastic is a practical method of achieving this. A metal insert useful for attaching to the antenna elements can be copper or other metal and can be formed in a segment of an antenna element. For example, the conductive thermoplastic element can be molded around a metal insert. Alternatively, the conductive thermoplastic element can be fabricated in a shape with a depression or void in which a metal insert can be fitted. Alternatively, a screw, such as a sheet-metal screw, can be used as the metal insert, since it tends to create a good pressure contact point with a large surface area. Due to low melting point of thermoplastics compared to metals, insertion of a hot metal insert into the thermoplastic is another method. A screw can be used in the metal insert to aid in electrical connections. Soldering or other electrical connection methods can also be used.

An example of a dipole antenna of this invention comprises two identical antenna elements that substantially share the same axis, formed from conductive thermoplastic compositions. The antenna elements each have a length and a cross section perpendicular to the length. For example, said length may be greater than three multiplied by the square root of the cross sectional area, to form an antenna that has a rod-like form. The electrical connections carrying either the transmission or reception signals are connected to the elements of the dipole. In many cases the connection is electrically symmetrical with respect to the system ground, using a balun (balanced-unbalanced transformer).

An example of a dipole antenna of this invention is shown in FIG. 1. In FIG. 1, the antenna, generally designated by the number (1), comprises an optional ground plane (2) that is substantially parallel to the antenna elements (3 and 4) and is separated from the antenna elements by an insulating material (5). The insulating material can be used to keep the antenna in place mechanically. When a conductive ground plane is used the thickness of the dielectric insulating material (5) is preferably more than one eighth of the operating wavelength of the antenna. Metal inserts (6 and 7) inserted into the antenna elements (3 and 4, respectively) are connected to signal leads (8 and 9, respectively). The metal inserts can be attached to the antenna elements as previously described. The signal leads may enter the antenna through an opening (10) in the ground plane (2) via a cable (11). As described above, the ground plane (2) is optional. If the ground plane is used it can also be formed of the conductive thermoplastic element of this invention. The cable (11) may be attached to the antenna by connecting the cable shield to the conductive ground plane by means of a metal insert (not shown) in the ground plane.

Figure 2:
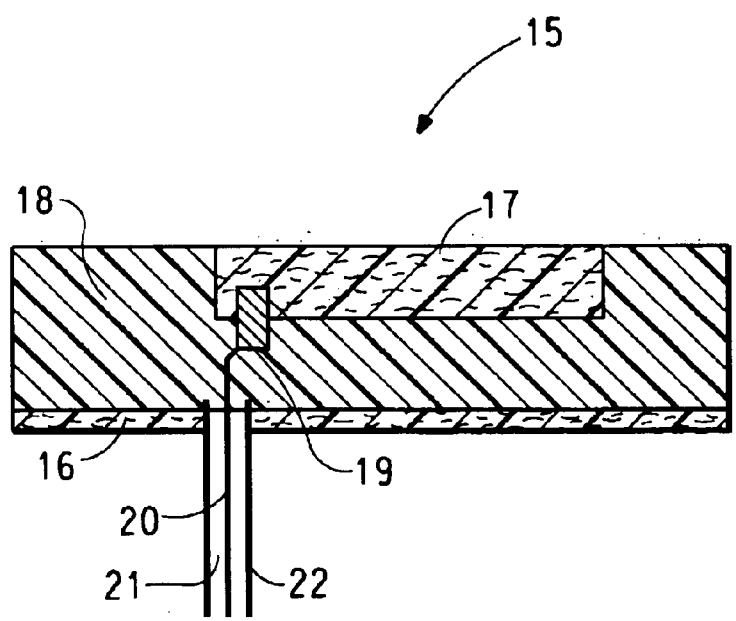
FIG. 2 is a cross-sectional view of a monopole antenna of this invention.

An example of a monopole antenna of this invention is shown in FIG. 2. In FIG. 2, the antenna, generally designated by the number (15), comprises an optional ground plane (16) that is separated from the antenna element (17) by an insulating material (18). The antenna element (17) is formed of a conductive thermoplastic composition of this invention and the ground plane (16) may be formed of a conductive thermoplastic composition. The insulating material can be used to keep the antenna in place mechanically. In some cases (not shown) the radiating antenna element (17) is arranged perpendicular to the ground plane and can be formed as a rod, sheet, shaped element or the like. Preferably, the height of the radiating element is greater than three times the square root of the cross sectional area of the radiating antenna element. An example of this antenna with a height of 1.17 inches will perform well at GPS frequencies of about 1.5 GHz. A metal insert (19) inserted into the antenna element (17) is connected to a signal lead (20). The metal insert can be attached to the antenna element as previously described. The signal lead (20) may enter the antenna through an opening (21) in the ground plane via a cable (22). For example, the cable (22) may be a coaxial cable and the coaxial cable center conductor (20) may be connected to the antenna element (17) by means of the metal insert (19). A ground wire (e.g. the shield in the coaxial cable) may be connected to the ground plane (16) by means of a metal insert (not shown) in the ground plane, or left unconnected in case of a non-ground plane monopole.

An example of a conformal antenna of this invention comprises a radiating antenna element and a ground plane formed from conductive thermoplastic compositions. Conformal antennas are suitable when a "low-profile" antenna or an antenna that can be integrated into the body of an electromagnetic device is desirable. A conformal antenna is an antenna that comprises a radiating antenna element and a ground plane each having the shape of a thin plate with a thickness and a separation between the plates provided by insulating standoffs. For example, the square root of the area of the plate forming the radiating antenna element can be greater than three multiplied by the thickness.

A coaxial cable may enter the conformal antenna through an opening in the ground plane. The coaxial cable shield is connected to the ground plane by means of a metal insert in the ground plane. The coaxial cable center conductor is connected to the radiating antenna element by means of a metal insert in the radiating antenna element. Alternatively, the coaxial cable may enter the antenna between the radiating antenna element and the ground plane. The coaxial cable shield is connected to the ground plane by means of a metal insert in the ground plane. The coaxial cable center conductor is connected to the radiating antenna element by means of a metal insert in the radiating antenna element.

In antenna structures of this invention comprising a conductive thermoplastic composition, it is preferable that the insulating material comprises a thermoplastic polymeric material that is not loaded with conductive micron fibers. Of note are antenna structures wherein the insulating material comprises the same polymeric material that forms the matrix of the conductive thermoplastic composition. The conductive layers of the radiating elements and ground plane and the insulating layer may be formed independently and then adhesively attached to one another to form the antenna. The antenna may also be fabricated by extrusion coating or laminating some or all of the layers onto a substrate. The substrate may be, for example, the ground plane.

Some of the components of the antenna may be formed together by coextrusion, particularly if the components are relatively coplanar. For example, a conformal antenna of this invention may comprise a layer of conductive thermoplastic composition, a layer of insulating thermoplastic material and another layer of conductive thermoplastic composition in a multilayer coextruded sheet. Additional layers optionally may be coextruded with the antenna components. For example, additional layers of thermoplastic resins may be included to provide surface layers to provide protection or improve the appearance of the antenna structure. Of note are multilayer structures comprising ionomeric materials in the conducting, insulating and surface layers. This multilayer structure could be further processed by thermoforming the sheet into a shaped article. For example, a sheet of the multilayer structure could be formed into a casing element for a portable communication device or it could be formed into a shaped piece that could be included in an automotive part such as a bumper, fender or panel.

The use of antennas of this invention in devices can result in lower cost devices by simplifying assembly (for example, by reduction in parts count by incorporation of the antenna material into housing components). The use of antennas of this invention in devices can also provide improved performance over devices equipped with conventional metal antennas.

Antennas of this invention have a number of uses. For example, a dipole or a monopole antenna formed of conductive thermoplastic compositions can be embedded in an automobile bumper formed of insulating material.

Figure 3:
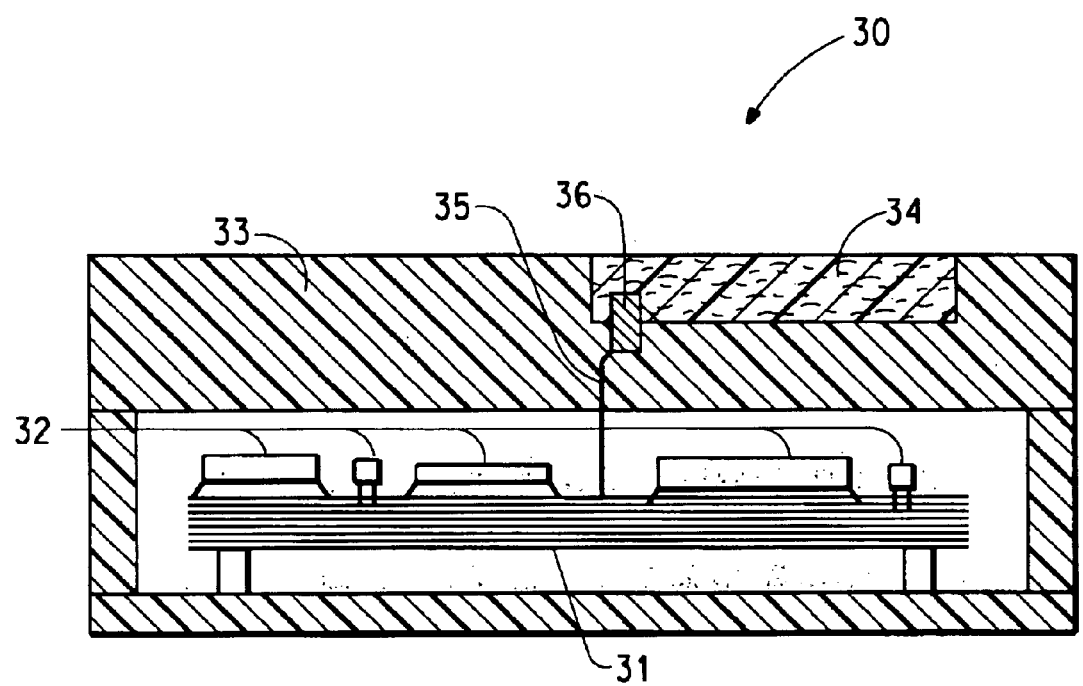
FIG. 3 is a cross-sectional view of a portable electronic device incorporating a monopole antenna of this invention.

Antennas of this invention can be used for a number of additional applications. For example, the molding of a window of a vehicle, such as an automobile or an airplane, can comprise an antenna of this invention wherein an antenna comprising the conductive thermoplastic composition is embedded in the molding or wherein the molding is formed at least partially of the conductive thermoplastic composition. Antennas of this invention can be embedded in the plastic housing, or comprise part of the plastic shell itself, of portable electronic devices such as cellular phones, personal computers, or the like. An example of such a device with an antenna of this invention is illustrated in FIG. 3. In FIG. 3, a portable electronic device (30) comprises a circuit board (31) to which are attached various electronic components (32). These components are useful in making the electronic device function for its intended purpose, but are not encompassed in the functioning of the antenna of this invention and are not specifically described herein. The circuit board (31) is housed in a housing or case (33) that is typically fabricated of a nonconductive thermoplastic material. A monopole antenna element (34) is embedded in the housing (33) and is attached to the circuit board (31) via a signal lead (35). The signal lead is connected to the antenna element (34) by means of a metal insert (36).

While the invention has been particularly shown and described with reference to the preferred embodiments thereof, it will be understood by those skilled in the art that various changes in form and details may be made without departing from the spirit and scope of the invention.

EXAMPLES

The following Examples are merely illustrative, and are not to be construed as limiting to the scope of the invention described and/or claimed herein.

Conductive Thermoplastic Compositions

Description of Processing and Testing of Materials

Examples of conductive thermoplastic compositions of this invention comprise stainless steel fibers dispersed in a polymeric matrix. See Table 1 below for specific examples. These compositions were prepared by mixing the stainless steel fiber and pellets of resin in a 30 mm twin screw extruder by either: (a) adding both the fiber and the polymer resin together at the rear (i.e., inlet of first zone) of the extruder, or (b) adding the resin at the rear of the extruder and then feeding the fiber separately at a point mid-way along the extruder barrel. Following mixing, the conductive thermoplastic composition was extruded through a die and cooled to produce an extruded fiber-polymer composite rope. Extruder screw speed was varied in the range of 50 to 150 revolutions per minute (RPM), and the temperature set-points along the extruder barrel were maintained between 180° C. and 260° C. The extruder die temperature was held at 300° C. and melt temperatures were in the range of 230° C. to 310° C. depending on the formulation and screw speed. The polymeric materials and the stainless steel fibers used to prepare the example compositions are described in the materials sections below.

As noted above, the initially formed composition can be further processed, such as by compression molding or by injection molding. For example, several 5.5-inch long samples were prepared by compression molding, by cutting lengths from the extruded rope produced as described above and placing these lengths in a cylindrical mold measuring 0.5 inches in diameter and 5.5 inches long. The filled mold was heated to 180° C. and subjected to 20 tons of force for approximately 10 to 20 minutes. The composite sample and mold were cooled by flowing cold water in the press while maintaining the 20 tons of force on the mold. Once cool, the composite specimen was removed from the mold.

Test specimens were also prepared by injection molding using a single-screw injection-molding machine using, typically, the following temperature profile and conditions:

Rear (inlet): 180° C.
Center: 180° C.
Front (outlet): 180° C.
Nozzle: 180° C.
Mold: 60° C.
Ram Speed: Fast
Screw Speed: 60 RPM
Injection Time: 30 sec
Hold Time: 20 sec
Total Cycle Time: 60 sec
Back Pressure: 50 psig The stainless steel content of the final specimens was determined by a standard ash method by first measuring the weight of the compression molded composite and then burning the organic polymer matrix away by heating the composite to 750° C. for 1.5 hours. After cooling to room temperature, the weight of the remaining steel was measured, and the percent of steel in the original specimen was calculated. See Table 2.

Also, the electrical resistance was assayed across the length of the 5.5-inch rod specimens by drilling a ⅛-inch deep hole in each rod end and inserting a probe at each end from a Fluke multimeter (Model 73-3). In addition, the electrical resistance of the extruded rope samples was also measured across a 5.5-inch long section of extruded rope. The electrical resistance reported in Table 2 is the minimum value displayed on the Fluke multimeter. These rope samples generally had diameters that were too small for drilling probe holes at each end, so resistance measurements were done by merely contacting the probe with each cut-end surface.

Flexural modulus of the compositions was determined using methods as described in ASTM method D790. Samples were prepared by compression molding, at 180° C., several 6-inch lengths of the extruded rope prepared as described above into 3 inch×6 inch×⅛ inch plaques. These plaques were then die-cut into flex bar specimens to conform to the appropriate dimensions for flexural modulus testing (5 inch×½ inch×⅛ inch) and the results are reported in Table 2.

Materials

A—Copolymer of ethylene, 9 weight % methacrylic acid, and 24 weight % n-butyl acrylate with the acid 51% neutralized using Zinc(II) cations on a molar basis resulting in an ionomer with a MI of 0.6 and a flexural modulus of 4,500 psi at 298° K.

B—Copolymer of ethylene and 15 weight % methacrylic acid with the acid 58% neutralized using Zinc(II) cations on a molar basis resulting in an ionomer with an MI of 0.7 and a flexural modulus of 50,000 psi at 298° K.

C—Copolymer of ethylene and 9 weight % methacrylic acid with the acid 18% neutralized using Zinc(II) cations on a molar basis resulting in an ionomer with an MI of 5.0 and a flexural modulus of 22,000 psi at D—Stainless steel fibers coated with an ionomer sizing and used as received from Bekaert Fibre Technologies. Sample sold under the trade name Beki-Shield® GR75/C12-E.

TABLE 1

| Example | Composition as Fed to Extruder (weight %) | Extruder Feed Position for Fiber Addition and Screw Speed | Measured Stainless Steel Content Ash Method (weight %) | Flex Modulus (psi) |
|---|---|---|---|---|
| 1 | 60% A/40% D | Side - 100 RPM | 31% | 59,400 |
| 2 | 60% A/40% D | Rear - 100 RPM | 32% | 40,600 |
| 3 | 60% B/40% D | Rear - 125 RPM | 34% | 90,000 |
| 4 | 80% B/20% D | Side - 125 RPM | 21% | 72,200 |
| 5 | 70% B/30% D | Side - 125 RPM | 27% | 85,000 |
| 6 | 60% B/40% D | Side - 125 RPM | 34% | 129,000 |
| 7 | 60% C/40% D | Side - 150 RPM | 31% | 88,400 |
| 8 | 60% C/40% D | Side - 50 RPM | 32% | 68,800 |
| 9 | 60% B/40% D | Side - 150 RPM | 34% | 95,800 |
| 10 | 60% B/40% D | Side - 50 RPM | 29% | 110,000 |

TABLE 2

| Example | Extruded Rope Diameter [inches] | Extruded Rope Electrical Resistance across 5.5 inches end-to-end [ohms] | Compression molded cylinder electrical resistance across 5.5 inches end-to-end (nominal cylinder diameter 0.5 inch) [ohms] |
|---|---|---|---|
| 1 | 0.37 | 10 | 3 |
| 2 | 0.37 | 17 | 2 |
| 3 | 0.22 | >32,000,000 | >32,000,000 |
| 4 | 0.18 | 88 | 26 |
| 5 | 0.18 | 40 | 6 |
| 6 | 0.17 | 19 | 5 |
| 7 | 0.23 | 65 | 2 |
| 8 | 0.23 | 52 | <2 |
| 9 | 0.23 | 92 | 2 |
| 10 | 0.24 | 48 | <2 |

It is desirable to prepare the conductive thermoplastic composition by using the least severe processing history capable of making a uniform composite in order to maintain the integrity of the conductive fibers within the matrix. The two most conductive examples (Examples 8 and 10) were produced by placing the stainless steel fiber (Material D) into the side of the mixing extruder at the mid-way point of the barrel and using a screw speed of only 50 RPM. These examples exhibited a resistance below the lower limit of the multimeter measuring equipment (i.e. less than 2 ohms). Evaluation of the conductive compositions by the ash method for determining stainless steel content produced steel ash that had a fibrous morphology.

Over processing the mixture can result in degradation of the fibrous nature of the conductive fibers by mechanical grinding and can result in a material that is not highly conducting (Example 3). In this sample, the same formulation as Example 10 was used but the stainless steel fiber was subjected to the entire twin-screw barrel length and a screw speed of 100 RPM. This resulted in a material with an electrical resistance that was greater than the maximum measurable by the Fluke multimeter of 32,000,000 ohms. Example 3 was the only sample that when evaluated by the ash method produced steel ash that had powder morphology.

Electrical Test for Comparison with Conventional Antennas

A monopole antenna comprising a conductive thermoplastic composition (CTC) prepared according to Example 8 consisting of a cylinder with the length of 5.125 inches (130 mm), and the cross sectional diameter of 0.5 inches (12.7 mm) was prepared by compression molding. The DC bulk conductivity of this material was measured at 1,272 S/m (resistivity of 0.078 Ohm-cm). The CTC monopole was placed at the center of a square-shaped copper ground plane with the dimensions of 12 inches×12 inches (30 cm×30 cm), and was insulated from the ground (Example 11). The comparison antenna was made of a copper wire with a length of 5.125 inches (130 mm), and a diameter of 0.032 inches (0.8 mm). This metallic antenna shape is commonly used in wireless communications systems. The copper antenna was also placed over a ground plane similar to that of the CTC antenna. In two consecutive tests the CTC and copper antennas were used as the transmitting antenna, and a standard broadband receiving antenna (manufactured by Polarad, Model CA-B) was used as the receiving antenna. A signal generator's output was fed into an amplifier with the gain of 13 dB, and the frequencies of 300 MHz to 1,000 MHz at 100 MHz intervals were used. The transmitting and receiving antennas were placed 15 feet (5 meters) Apart. A spectrum analyzer was used to gauge the intensity of the Received signal at test frequencies. The results are reported in Table 3.

TABLE 3

| | Received Signal (dBm/µW) | |
|---|---|---|
| Frequency (MHz) | CTC Antenna (Example 11) | Copper Antenna |
| 300 | −39.2/0.12 | −43.0/0.05 |
| 400 | −26.3/2.3 | −30.5/0.89 |
| 500 | −29.9/1.02 | −29.0/1.25 |
| 600 | −23.8/4.16 | −25.1/3.09 |
| 700 | −26.2/2.39 | −26.2/2.39 |
| 800 | −24.7/3.38 | −27.1/1.94 |
| 900 | −24.6/3.46 | −27.7/1.69 |
| 1000 | −37.0/0.20 | −43.3/0.047 |

Both antennas, at 130 mm, are quarter wavelength long at the frequency of 576 MHz. According to antenna theory and practice, quarter wavelength is the optimum operating condition for a monopole antenna, where the best impedance match to the feed transmission line is obtained. Of note are CTC antennas of this invention operating from about 300 MHz to about 1,000 MHz. The results reported in Table 3 suggest that at frequency range close to 576 MHz the two monopoles have close to equal performance, while outside of this range, where the antennas are not quarter wavelength, the CTC antenna delivers much higher levels of signal. For example, at 300 MHz, where the antennas are at ⅛ (0.125) wavelength, the CTC antenna delivers 2.4 times the signal strength as the metal antenna. Of note are CTC antennas of this invention operating at less than ¼ wavelength. This is particularly important in commercial and portable wireless applications where stringent requirements of bulk and mass make the usage of shorter antennas necessary. There are also many applications for longer-than-optimal antennas, and at these conditions the CTC antenna also delivers better performance as suggested by comparison with the copper antenna at 1,000 MHz. Of note are CTC antennas of this invention operating at greater than ¼ wavelength. The above improvements over the existing antenna art are not predicted in the conventional antenna practice, and provide an unexpected advantage.

In the optimum quarter-wavelength mode, where the antennas deliver close to equal performance, the CTC antenna has the mechanical advantages over the metal antenna as mentioned before.

Examples 12 through 51

Compositions as described in Table 4 were prepared by mixing the materials in an extruder according to techniques similar to those described for Examples 1 through 10. The compositions were injection molded or compression molded according to techniques similar to those described for Examples 1 through 10 into plaques about 2.2±0.1 inches in length, 0.5±0.05 in width and 0.135±0.01 in thickness. Conductivity, volume resistivity, and antenna performance were measured on the plaques according to the procedures described above and compared to a copper block of the same dimensions (conductivity $5.8 \times 10^7$ S/m) and reported in Table 6.

Materials

F—Polypropylene homopolymer, density 0.909, MI of 3.5, available from Phillips Sumika as Marlex HGX-030.

G—Chopped carbon fiber, 95% carbon content, 0.25 inch (6 mm) fiber length, Panex 35 grade, available from Zoltek.

H—High density polyethylene containing about 1.1 weight % maleic anhydride comonomer, MI of 1.5 to 2.5, available as Fusabond® E MB-100D.

I—Copolymer of ethylene and 19 weight % methacrylic acid with 36% of the acid moieties neutralized using Zinc(II) cations (2.57 weight %) resulting in an ionomer with an MI of 1.0.

J—Milled carbon powder, 99.5% carbon content, about 150 micron (6 mil) standard mean length, Panex 30 grade, available from Zoltek.

K—Low density polyethylene, density 0.930, MI of 1.5, grade 1078 available from Huntsman.

L—4 mm Stainless steel fibers coated with an ionomer sizing and used as received from Bekaert Fibre Technologies. Sample sold under the trade name Beki-Shield® GR 75/C12-E/4.

M—5 mm Stainless steel fibers coated with an ionomer sizing and used as received from Bekaert Fibre Technologies. Sample sold under the trade name Beki-Shield® GR 75/C12-E/5.

In Tables 4 through 6, "NA" indicates "not applicable," "ND" indicates "not determined." In cases where the samples tested were prepared in different ways, "CM" indicates samples were prepared by compression molding and "IM" indicates samples that were prepared by injection molding.

TABLE 4

| Example | Composition | Measured Stainless Steel Content Ash Method (weight %) | Flex Modulus (kpsi) |
|---|---|---|---|
| Injection Molded samples | | | |
| C1 | 100% C | NA | 20.2 |
| 12 | 80% C/20% D | 16.0 | 41.4 |
| 13 | 70% C/30% D | 23.0 | 56.0 |
| 14 | 60% C/40% D | 32.5 | 81.2 |
| Compression Molded samples | | | |
| 15 | 80% C/20% D | ND | 46.3 |
| 16 | 70% C/30% D | ND | 65.7 |
| 17 | 60% C/40% D | ND | 100 |
| 18 | 80% C/20% D | 15.5 | 42.9 |
| 19 | 70% C/30% D | 23.0 | 68.1 |
| 20 | 60% C/40% D | 32.0 | 121 |
| 21 | 80% F/20% D | 16.0 | 257 |
| 22 | 70% F/30% D | 22.5 | 315 |
| 23 | 60% F/40% D | 30.5 | 332 |
| 24 | 80% C/20% G | NA | 444 |
| 25 | 70% C/30% G | NA | 430 |
| 26 | 60% C/40% G | NA | 841 |
| 27 | 60% C/40% D 100 rpm | 32.0 | CM - 108 IM - 86.2 |
| 28 | 60% E/40% D 150 rpm | 33.0 | CM - 88.2 IM - 67.4 |
| 29 | 55% C/40% D/ 5% H 100 rpm | 35.5 | CM - 90.8 IM - 82.0 |
| 30 | 55% C/40% D/ 5% H 150 rpm | 36.5 | CM - 107 IM - 75.3 |
| 31 | 50% C/40% D/ 10% H 100 rpm | 35.5 | CM - 111 IM - 83.4 |
| 32 | 50% C/40% D/ 10% H 150 rpm | 32.5 | CM - 97.4 IM - 72.5 |
| 33 | 60% C/40% D | 33.5 | CM - 119 IM - 87.7 |
| C2 | 100% I | NA | CM - 56.1 |
| 34 | 80% I/20% D | 19.5 | CM - 108 IM - 69.7 |
| 35 | 60% I/40% D | 43.0 | CM - 221 IM - 157 |
| 36 | 60% C/40% D + 5% ZnO | 37 | CM - 146 IM - 119 |
| 37 | 60% I/40% D + 5% ZnO | 37 | CM - 224 IM - 162 |
| 38 | 60% I/40% D + 10% ZnO | 36 | CM - 220 IM - 185 |
| 39 | 60% C/40% G | NA | 812 |
| 40 | 60% C/35% G/ 5% J | NA | 896 |
| 41 | 60% C/30% G/ 10% J | NA | 777 |
| 42 | 60% K/40% G | NA | 728 |
| 43 | 60% K/35% G/ 5% J | NA | ND |
| 44 | 60% K/30% G/ 10% J | NA | 617 |
| 45 | 60% C/30% G/ 10% J | NA | 811 |
| 46 | 60% C/20% G/ 20% J | NA | 675 |
| 47 | 54.5% I/27.3% G/18.2% J | NA | 1200 |
| 48 | 60% C/30% G/ 10% J | NA | 1190 |
| 49 | 60% C/20% G/ 20% J | NA | 854 |
| 50 | 60% K/30% G/ 10% J | NA | 598 |
| 51 | 60% K/20% G/ 20% J | NA | 482 |

The materials of Examples 12 through 51 were fabricated into test antennas by machining a block of the material to a block with the following sizes: 2.25 inches long×0.5 inches wide×0.12 inches thick (57.15 mm×12.7 mm×3.18 mm). The antennas were used as a monopole on a copper ground plane with the dimensions of 12 inches×12 inches (30.5 cm×30.5 cm). The long dimension of the test antenna (2.25 inch) was placed vertical to the ground plane, and a 0.1 inch thick layer of PTFE insulation was placed between the antenna and the ground plane. The test antennas were used to receive a 1.0 GHz signal sent from a transmit antenna which was a wide band Polarad cone antenna (Model C-AB) and placed within the compact range at the distance of two feet (60 cm). The length of the monopole antenna (57.15 mm) is about 20% of the wavelength at 1 GHz, which is close to an optimal quarter wavelength monopole. All test antennas were compared against a copper block antenna made at the same dimensions as the test antennas. The signal received for each case was compared to the signal received by the copper block antenna in dB, and then converted to percent amplitude below copper (i.e., "dB Signal Below Cu Block" is mathematically converted to "% Amplitude of Copper" as shown in Table 5) using the exponential formula:

[10\*\*(0.10\*(dB signal below copper))]\*100.

Note that the nature of comparison with the copper antenna used in these tests is different than the one used to provide the data in Table 3. In that test, the comparison was to a copper wire antenna, which is similar to what is used in a typical wireless system. The data in Table 3 provide a broadband set of data that compares the test antenna performance with the copper wire antenna over a wide frequency range. The data in Table 5, however, compare the signal strength between antennas of different composition and a corresponding copper block antenna at one frequency.

TABLE 5

| Example | Conductivity (S/m) | dB Signal Below Cu Block | % Amplitude of Copper | Volume Resistivity (ohm-cm) |
|---|---|---|---|---|
| 12 | Very Low | −8.85 | 13.00 | Very High |
| 13 | 8.6 | −2.95 | 50.70 | 11.62 |
| 14 | 403 | −0.95 | 80.30 | 0.25 |
| 15 | 398 | −0.90 | 81.30 | 0.25 |
| 16 | 1239 | −1.00 | 79.40 | 0.08 |
| 17 | 3486 | −0.55 | 88.10 | 0.03 |
| 18 | 118 | −2.00 | 63.00 | 0.85 |
| 19 | 1344 | −0.65 | 86.00 | 0.07 |
| 20 | 4414 | −0.55 | 88.10 | 0.02 |
| 21 | 3005 | −0.57 | 87.70 | 0.03 |
| 22 | 4169 | −0.63 | 86.50 | 0.02 |
| 23 | 7448 | −0.40 | 91.20 | 0.01 |
| 24 | 116 | −1.60 | 69.20 | 0.86 |
| 25 | 130 | −1.00 | 79.40 | 0.76 |
| 26 | 533 | 0.00 | 88.50 | 0.19 |
| 27 | 2524 | −0.55 | 88.10 | 0.04 |
| 28 | 1891 | −0.52 | 88.70 | 0.05 |
| 29 | 2949 | −0.37 | 91.80 | 0.03 |
| 30 | 2069 | −0.52 | 88.70 | 0.05 |
| 31 | 2817 | −0.44 | 90.36 | 0.04 |
| 32 | 2942 | −0.65 | 86.10 | 0.03 |
| 33 | 3587 | −0.45 | 90.10 | 0.03 |
| 34 | 636 | −0.70 | 85.10 | 0.16 |
| 35 | 5517 | −0.35 | 92.20 | 0.02 |
| 36 | 2135 | −0.35 | 92.20 | 0.05 |
| 37 | 2206 | −0.65 | 86.10 | 0.05 |
| 38 | 2135 | −0.59 | 87.29 | 0.05 |
| 39 | 675 | −0.47 | 89.70 | 0.15 |
| 40 | 756 | −0.40 | 90.20 | 0.13 |
| 41 | 500 | −0.28 | 93.75 | 0.20 |
| 42 | 817 | −0.55 | 88.10 | 0.12 |
| 43 | ND | ND | ND | ND |
| 44 | 525 | −0.55 | 88.10 | 0.19 |
| 45 | 378 | −0.81 | 82.99 | 0.26 |
| 46 | 270 | −0.83 | 82.60 | 0.37 |
| 47 | 79 | −0.83 | 82.60 | 1.25 |
| 48 | 133 | −1.06 | 78.34 | 0.75 |
| 49 | 63 | −1.26 | 74.82 | 1.57 |
| 50 | 302 | −0.68 | 85.51 | 0.33 |
| 51 | 236 | −0.72 | 84.72 | 0.42 |

Having thus described and exemplified the invention with a certain degree of particularity, it should be appreciated that the following claims are not to be so limited but are to be afforded a scope commensurate with the wording of each element of the claim and equivalents thereof.

We claim:

1. An antenna comprising a conductive thermoplastic composition comprising 15 to 70 weight percent conductive fibers dispersed in a structural matrix, wherein said structural matrix comprises at least one thermoplastic structural resin having a dielectric constant of less than 5.0 at 1 kilohertz; provided
   (i) when said composition comprises a polyamide resin or an epoxide resin, an additional thermoplastic structural resin must also be present;
   (ii) when said composition comprises a polyester resin, an additional thermoplastic structural resin other than an acrylonitrile/styrene/acrylate resin must also be present.

2. The antenna of claim 1 wherein the conductive thermoplastic composition comprises at least one thermoplastic structural resin having a dielectric constant of less than 3.0 at 1 kilohertz.

3. The antenna of claim 1 wherein the conductive thermoplastic composition comprises at least one thermoplastic structural resin having a dielectric constant of from 2.0 to 2.8 at 1 kilohertz.

4. The antenna of claim 1 wherein the conductive thermoplastic composition comprises at least one thermoplastic structural resin selected from the group consisting of polyolefins; polyphenylene oxides; fluorinated polymers; and ionomeric resins.

5. The antenna of claim 4 wherein the conductive thermoplastic composition comprises an ionomeric resin.

6. The antenna of claim 5 wherein the conductive thermoplastic composition comprises an ionomeric resin comprising one or more E/X/Y copolymers where E is ethylene, X is derived from a $C_3$ to $C_8$ α,β ethylenically unsaturated carboxylic acid, and Y is derived from an alkyl acrylate or an alkyl methacrylate wherein the alkyl groups have from 1 to 8 carbon atoms, and wherein X is present in from 2 to 30 weight % of the E/X/Y copolymer, Y is present from 0 to 40 weight % of the E/X/Y copolymer, and said E/X/Y copolymer has a weight average molecular weight of from 80,000 to 500,000, and is at least partially neutralized by one or more alkali metal, transition metal, or alkaline earth metal cations.

7. The antenna of claim 6 wherein said E/X/Y copolymers are ethylene copolymers having from 7 to 20 weight % acrylic acid or methacrylic acid as X and from 0 to 30 weight % alkyl (meth)acrylates as Y.

8. The antenna of claim 7 wherein said E/X/Y copolymers have from 0 to 15 weight % alkyl (meth)acrylates as Y.

9. The antenna of claim 7 wherein said E/X/Y copolymers are selected from the group of copolymers consisting of a copolymer of ethylene, 9 weight % methacrylic acid, and 24 weight % n-butyl acrylate with 51% of the carboxylic acid groups neutralized using Zinc(II) cations; a copolymer of ethylene and 15 weight % methacrylic acid with 58% of the carboxylic acid groups neutralized using Zinc(II) cations; a copolymer of ethylene and 9 weight % methacrylic acid with the acid 18% neutralized using Zinc(II) cations; and a copolymer of ethylene and 19 weight % methacrylic acid with 36% of the carboxylic acid groups neutralized using Zinc(II) cations.

10. The antenna of claim 9 wherein said E/X/Y copolymers are selected from the group of copolymers consisting of a copolymer of ethylene, 9 weight % methacrylic acid, and 24 weight % n-butyl acrylate with the acid 51% neutralized using Zinc(II) cations; a copolymer of ethylene and 15 weight % methacrylic acid with the acid 58% neutralized using Zinc(II) cations; and a copolymer of ethylene and 9 weight % methacrylic acid with the acid 18% neutralized using Zinc(II) cations.

11. The antenna of claim 7 wherein said E/X/Y copolymer is blended with at least one additional nonionomeric thermoplastic resin selected from the group consisting of polyurethane; polyurea; polyamide; polyester; polycarbonate; polystyrene; acrylics; copoly-ether-ester; copoly-ether-amide; copoly-ether-urethane; copoly-ether-urea; polyolefins; elastomeric polyolefins; polyethylene; polypropylene; ethylene copolymers derived from copolymerization of ethylene and polar comonomers selected from the group consisting of vinyl acetate, alkyl (meth)acrylate, carbon monoxide, and epoxy containing comonomers; maleic anhydride modified polymers; and thermoplastic elastomers based on styrene-butadiene block copolymers.

12. The antenna of claim 11 wherein said E/X/Y copolymer is blended with polyethylene containing about 1 weight % maleic anhydride comonomer.

13. The antenna of claim 4 wherein the conductive thermoplastic composition comprises a polyethylene resin.

14. The antenna of claim 4 wherein the conductive thermoplastic composition comprises a polypropylene resin.

15. The antenna of any of claims 1 through 14 wherein the conductive thermoplastic composition comprises stainless steel fibers as the conductive fibers.

16. The antenna of claim 15 wherein the conductive thermoplastic composition comprises from 18 weight % to 60 weight % stainless steel fibers.

17. The antenna of claim 16 wherein the conductive thermoplastic composition comprises from 25 weight % to 50 weight % stainless steel fibers.

18. The antenna of claim 17 wherein the conductive thermoplastic composition comprises from 28 weight % to 42 weight % stainless steel fibers.

19. The antenna of any of claims 1 through 14 wherein the conductive thermoplastic composition comprises carbon fibers as the conductive fibers.

20. A conductive thermoplastic composition comprising 15 to 70 weight percent conductive fibers dispersed in a structural matrix comprising an ionomeric resin.

21. The conductive thermoplastic composition of claim 20 wherein the ionomeric resin comprises one or more E/X/Y copolymers where E is ethylene, X is derived from a $C_3$ to $C_8$ α,β ethylenically unsaturated carboxylic acid, and Y is derived from an alkyl acrylate or an alkyl methacrylate wherein the alkyl groups have from 1 to 8 carbon atoms, and wherein X is present in from 2 to 30 weight % of the E/X/Y copolymer, Y is present from 0 to 40 weight % of the E/X/Y copolymer and said E/X/Y copolymer has a weight average molecular weight of from 80,000 to 500,000, and is at least partially neutralized by one or more alkali metal, transition metal, or alkaline earth metal cations.

22. The conductive thermoplastic composition of claim 21 wherein said E/X/Y copolymers are ethylene copolymers having from 7 to 20 weight % acrylic acid or methacrylic acid as X and from 0 to 30 weight % alkyl (meth)acrylates as Y.

23. The conductive thermoplastic composition of claim 22 wherein said E/X/Y copolymers have from 0 to 15 weight % alkyl (meth)acrylates as Y.

24. The conductive thermoplastic composition of claim 21 wherein said E/X/Y copolymers are selected from the group of copolymers consisting of a copolymer of ethylene, 9 weight % methacrylic acid, and 24 weight % n-butyl acrylate with 51% of the carboxylic acid groups neutralized using Zinc(II) cations; a copolymer of ethylene and 15 weight % methacrylic acid with 58% of the carboxylic acid groups neutralized using Zinc(II) cations; a copolymer of ethylene and 9 weight % methacrylic acid with the acid 18% neutralized using Zinc(II) cations; and a copolymer of ethylene and 19 weight % methacrylic acid with 36% of the carboxylic acid groups neutralized using Zinc(II) cations.

25. The conductive thermoplastic composition of claim 24 wherein said E/X/Y copolymers are selected from the group of copolymers consisting of a copolymer of ethylene, 9 weight % methacrylic acid, and 24 weight % n-butyl acrylate with the acid 51% neutralized using Zinc(II) cations; a copolymer of ethylene and 15 weight % methacrylic acid with the acid 58% neutralized using Zinc(II) cations; and a copolymer of ethylene and 9 weight % methacrylic acid with the acid 18% neutralized using Zinc(II) cations.

26. The conductive thermoplastic composition of any of claims 20 through 25 wherein the conductive thermoplastic composition comprises stainless steel fibers as the conductive fibers.

27. The conductive thermoplastic composition of claim 26 wherein the conductive thermoplastic composition comprises from 18 weight % to 60 weight % stainless steel fibers.

28. The conductive thermoplastic composition of claim 27 wherein the conductive thermoplastic composition comprises from 25 weight % to 50 weight % stainless steel fibers.

29. The conductive thermoplastic composition of claim 28 wherein the conductive thermoplastic composition comprises from 28 weight % to 42 weight % stainless steel fibers.

30. A conductive thermoplastic composition comprising 15 to 70 weight percent conductive fibers dispersed in a structural matrix comprising a polyolefin resin.

31. The conductive thermoplastic composition of claim 30 wherein the conductive thermoplastic composition comprises a structural matrix comprising a polyethylene resin.

32. The conductive thermoplastic composition of claim 31 wherein the conductive thermoplastic composition comprises from 18 weight % to 60 weight % stainless steel fibers.

33. The conductive thermoplastic composition of claim 30 wherein the conductive thermoplastic composition comprises a structural matrix comprising a polypropylene resin.

34. The conductive thermoplastic composition of claim 33 wherein the conductive thermoplastic composition comprises from 18 weight % to 60 weight % stainless steel fibers.

35. A method of fabricating an antenna comprising:
(a) dispersing from 15 to 70 weight percent conductive fibers in a structural matrix comprising at least one thermoplastic structural resin having a dielectric constant of less than 5.0 at 1 kilohertz to form a conductive thermoplastic composition;
(b) forming said conductive thermoplastic composition into the desired shape for an antenna; provided
(i) when said composition comprises a polyamide resin or an epoxide resin, an additional thermoplastic structural resin must also be present;
(ii) when said composition comprises a polyester resin, an additional thermoplastic structural resin other than an acrylonitrile/styrene/acrylate resin must also be present.

36. The method of claim 35 wherein the structural matrix comprises at least one thermoplastic structural resin having a dielectric constant of less than 3.0 at 1 kilohertz.

37. In an antenna element comprising a structural matrix containing dispersed conductive fibers, wherein the improvement comprises using as said structural matrix an ionomeric resin comprising one or more E/X/Y copolymers where E is ethylene, X is derived from a $C_3$ to $C_8$ $\alpha,\beta$ ethylenically unsaturated carboxylic acid, and Y is derived from an alkyl acrylate or an alkyl methacrylate wherein the alkyl groups have from 1 to 8 carbon atoms, and wherein X is present in from 2 to 30 weight % of the E/X/Y copolymer, Y is present from 0 to 40 weight % of the E/X/Y copolymer and said E/X/Y copolymer has a weight average molecular weight of from 80,000 to 500,000, and is at least partially neutralized by one or more alkali metal, transition metal, or alkaline earth metal cations.

* * * * *